United States Patent
Born et al.

(10) Patent No.: US 6,617,893 B1
(45) Date of Patent: Sep. 9, 2003

(54) DIGITAL VARIABLE CLOCK DIVIDER

(75) Inventors: Richard M. Born, Fort Collins, CO (US); Jackson L. Ellis, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/052,849

(22) Filed: Mar. 31, 1998

(51) Int. Cl.[7] ............................................. H03K 21/00
(52) U.S. Cl. ..................... 327/115; 327/117; 327/232; 327/235; 327/248; 327/299
(58) Field of Search ................. 327/115, 117, 327/232, 235, 248, 299

(56) References Cited

U.S. PATENT DOCUMENTS

| | | | |
|---|---|---|---|
| 4,573,176 A | 2/1986 | Yeager | 377/48 |
| 4,935,944 A | 6/1990 | Everett | 377/48 |
| 5,339,345 A | 8/1994 | Mote, Jr. | 377/48 |
| 5,410,683 A | 4/1995 | Al-Khairi | 395/550 |
| 5,442,670 A | 8/1995 | Shu | 377/48 |
| 5,477,181 A | 12/1995 | Li et al. | 327/258 |
| 5,790,614 A | * 8/1998 | Powell | 375/376 |

* cited by examiner

Primary Examiner—Margaret R. Wambach
(74) Attorney, Agent, or Firm—Lathrop & Gage, L.C.

(57) ABSTRACT

A clock divider circuit and methods of operating same includes a standard integral clock divider circuit and a phase slip non-integral divider circuit for high granularity non-integral clock division. A multi-phase frequency synthesizer produces a plurality of phases of a clock frequency and applies the multiple phases to the divider circuit of the present invention. In a first embodiment, each phase is applied to a phase slip divider circuit which includes a integral divider portion and a programmable phase slip divider portion which receives the output of the integral division portion. Each phase of the input clock may therefore be divided by a wide variety of integral and non-integral divisors. In a second, simpler embodiment, a multi-phase frequency synthesizer produces a plurality of phases and applies the phases to a single phase slip divider. The single phase slip divider of the second embodiment may be configured to stay or shift on each phase of the clock in that consecutive phases may be merged or may remain distinct in the output signal of the phase slip non-integral divider portion of the circuit. The output of the phase slip divider of the second embodiment is then applied to an integral divider portion to produce the final output clock signal. Both embodiments provide for integral and non-integral division of a multi-phase input clock signal. The first embodiment provides for additional flexibility at the expense of added complexity relative to the first embodiment.

20 Claims, 6 Drawing Sheets

PHASE SLIP DIVIDER

INTEGER DIVIDER

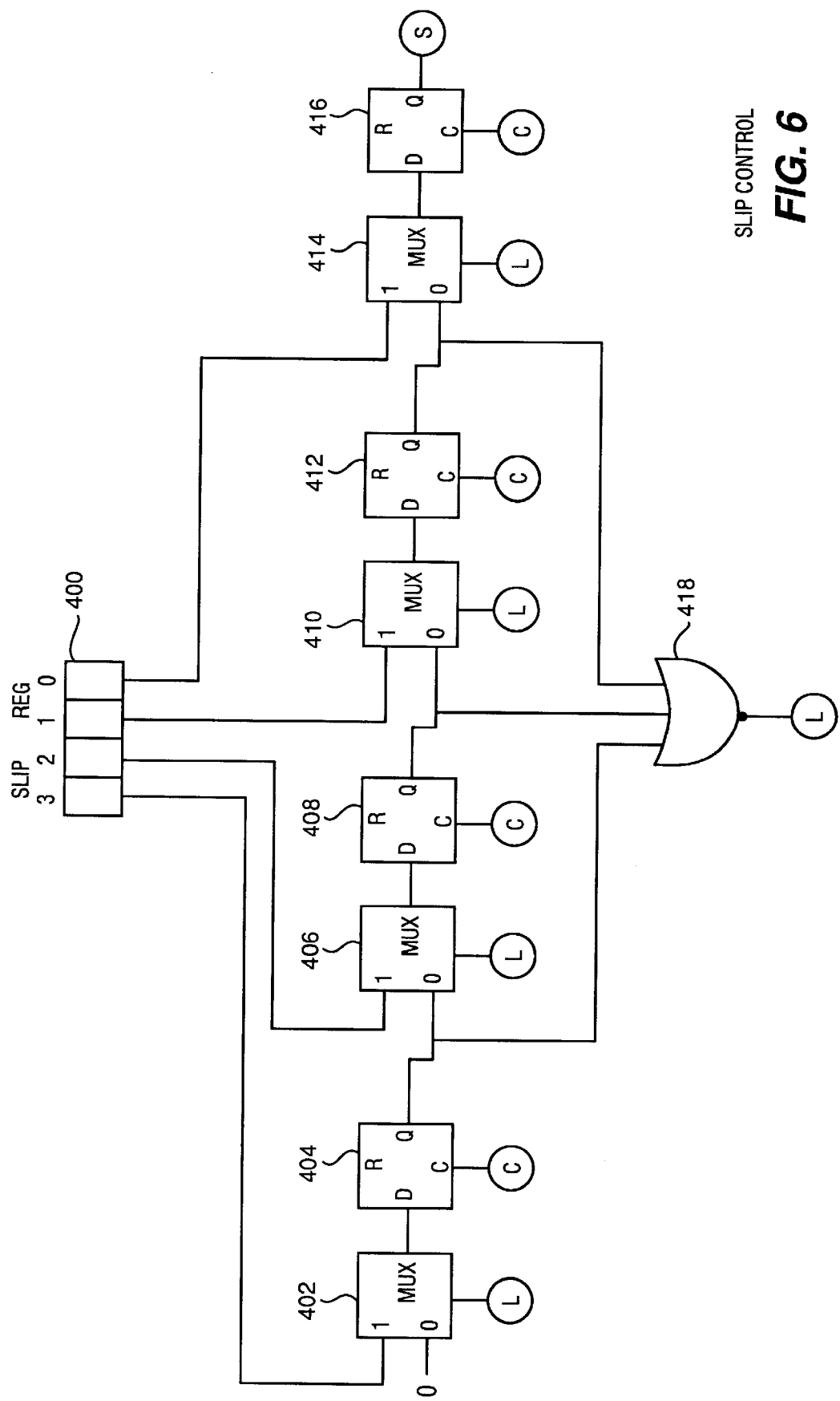
FIG. 6 SLIP CONTROL

DIGITAL VARIABLE CLOCK DIVIDER

BACKGROUND OF THE INVENTION

1. Field of the Invention

This invention relates to frequency synthesis and division and more particularly to a digital variable clock divider circuit which uses phase slip techniques to provide a wider range of available output frequencies from a given input frequency.

2. Description of Related Art

Frequency dividers are well known in the digital arts to provide a selectable variety of output clock waveform frequencies from a single input clock waveform signal. Such devices are useful in the digital electronic arts to provide a variety of output clock signals at various frequencies for use by components of an electronic circuit. For example, a processor (CPU) device in an electronic application may use a different frequency clock waveform than associated memory devices. Likewise, attached peripheral I/O controller devices may require still other clock signal frequencies. Rather than provide a plurality of discrete frequency generating oscillators on such an application circuit, simpler, less costly, frequency divider devices are applied to generate one or more additional frequencies from a single input signal waveform. Each frequency divider circuit can produce a particular frequency by "dividing" the input signal waveform to produce a desired output signal waveform having the desired frequency.

As taught by prior techniques, many frequency divider circuits are capable of producing only integral multiples of the applied input frequency. In other words, the output frequency from frequency dividers as previously taught in the art can produce output waveforms having the input waveform frequency divided by 2, 3, 4, etc.

Frequency divider circuits are often applied for clock timing used in a memory controller. The memory controller controls a wide variety of timing parameters in the associated memory devices and therefore requires high granularity from the derived frequencies. Mere integer division of the input frequency does not provide sufficient granularity of the generated (synthesized) clock signals.

Other known frequency divider designs are capable of producing output frequencies through division by integer and non-integer values. Some such circuit designs, for example, use a frequency synthesizer to multiply the input clock by an integer N and then perform an integral division of that resultant clock by an integer M. The resultant clock is therefore an N/M division of the input clock. However, the particular selections of M and N are fixed by the standard integer division circuits used. In addition, such designs require the addition of a frequency synthesizer analog component. Such devices are not only relatively complex, but such analog components tend to introduce problems relating to circuit packaging and power dissipation as compared to digital circuits.

Another simple technique for achieving non-integer division of a clock signal which avoids use of complex analog components is one which uses both the rising and falling edge of the input clock signal to derive a frequency which is an integer division of twice the input frequency. This simple technique, though simpler than the above noted frequency synthesizer approach, is limited in the flexibility of non-integral division capability. Only divisions of twice the input frequency may be generated.

In view of the above it is clear that a need exists to derive an output waveform from an input waveform with a simple circuit capable of producing integer as well as non-integer divisions of the input waveform frequency. In addition, a need exists for such a circuit to produce a wide variety of integer and non-integer divisions of the input waveform frequency to thereby increase the granularity of frequency selections for the derived output waveform frequency. Lastly, there is a need for such a circuit to be simple using digital logic as distinct from analog components.

SUMMARY OF THE INVENTION

This present invention solves the above and other problems, thereby advancing the useful arts, by providing an electronic circuit and associated method of operation to synthesize a desired output clock waveform from multiphase input clock waveforms using combinations of integer and non-integer divisions of the input clocks available for generation of the output clock. In addition, the circuits of the present invention generate the desired clocks using exclusively digital logic devices thereby avoiding problems known in the use of analog frequency synthesizers, and other analog circuits. The circuit of the present invention includes a first portion for performing well known integral division of the input clock waveforms in combination with a second portion for phase slip control to perform non-integer division of the source input waveform. A control portion of the circuit multiplexes and integrates the operation of the other two portions to thereby produce a desired output waveform as a divided transformation of the source input clock.

The source input signal is provided by a multi-phase frequency synthesizer producing a plurality of phases of a fixed frequency clock. The plurality of phases supplied are preferably at fixed and equal relative phase offsets. The period of the output signal of the digital divider circuit of the present invention is a multiple of its input signal period plus or minus a multiple of the minimal phase shift provided by the phase portion of the circuit. The phase control portion of the circuit includes a plurality of single phase slip circuits each associated with one of the multiple source input phases for control of the combination of the multiple input phases to produce the desired waveform. A standard integral divider circuit in each single phase slip circuit first performs a desired integral division on the source input clock. This intermediate output clock signal is then applied to the phase slip portion of the single phase slip circuit for generation of the final desired output clock waveform.

For example, if the frequency synthesizer portion of the present invention has four evenly spaced output phases, then the period of the output signal waveform of the digital clock divider of the present invention can be the input period times 1.00, 1.25, 1.50, 1.75, 2.00, 2.25, etc. Thus, the simple addition of more synthesizer phases in the frequency synthesizer portion (and associated single phase slip circuits) provides higher granularity options for the output signal waveform frequency.

In a first embodiment of the present invention, an input clock waveform signal is first divided by an integral divisor. The result of the integer division is then applied to the phase slip portion of the circuit to generate the desired output waveform. In a second embodiment of the present invention, the input signal waveform is first applied to the phase shift portion of the circuit. The result of the phase shift is then applied to a standard integer clock divider to generate the desired output signal waveform. The first embodiment is capable of generating a wider variety of output waveforms than is the second embodiment. However, the second embodiment is simpler and therefore less costly in particular applications. The preferred or best presently known mode as between these two options depends upon the particular requirements of a particular application.

In the first embodiment, a frequency synthesizer portion generates multiple phase shifted output waveforms from an input waveform signal. The predetermined phases of the waveform are applied to the divider circuit of the present invention, one phase output applied to a unique one of a plurality of single phase slip dividers. A ripple shift register is used to align the multiple phases applied to the divider portion of the present invention. Each phase aligned waveform synchronously clocks one of a plurality of single phase slip divider circuits to produce an output clock phase aligned to this synthesizer phase. Each single phase slip divider circuit also synchronously determines when its generated output should be applied to the output of the divider by providing a first level multiplexing of the final output phase signal. A shift register within each single phase slip divider controls the multiplexing of the output signal of each single phase slip divider for application to the out signal path of the divider.

More specifically, each frequency synthesizer phase output is divided by an integer value to produce the base period applied to each of the plurality of single phase slip dividers. Each single phase slip divider circuit determines when its output clock phase should become the output clock for the digital divider. This determination is controlled by a shift register in each single phase slip divider which shifts on each base divide. For example, phase 0 could cause the final output to become high first, then phase 1 could cause the final output to become high, then phases 2, 3, 4, 5, etc. in turn. This results in a waveform where the next active pulse is slipped by the difference between phases. The base divide (integral divide) and the number of phases to slip each time is programmable such that the resulting period can be programmed to any multiple of the basic phase shift delta.

In the second embodiment of the present invention, a phase slip circuit can optionally switch to the earlier phase of the frequency synthesizer outputs at each clock edge. This embodiment of the divider circuit of the present invention, while simpler and thereby less costly, allows a maximum frequency which is (n−1)/n of the frequency synthesizer's base frequency (where n is the number of phases generated by the multi-phase frequency synthesizer). This circuit can optionally remain on the same phase output at each clock edge to thereby allow the resultant output waveform frequency to be varied. A separate ring counter of variable length indicates when to shift to the next phase or stay on the same phase (non-shifts). As above in the first embodiment, a standard integral divider circuit is used to further reduce the output frequency toward the desired frequency. Since each period of the standard integral divider output waveform must be the same (to repeat the desired waveform), the number of shifts and non-shifts in the phase slip circuit must be the same during each period of the integral divider output waveform.

It is therefore an object of the present invention to provide a clock divider circuit and associated methods of operation which provides integral and non-integral clock division.

It is a further object of the present invention to provide a clock divider circuit and associated methods of operation which provides integral and non-integral clock division with improved granularity of non-integral clock division.

It is still a further object of the present invention to provide a clock divider circuit and associated methods of operation which combine an integral division of a clock with a variable phase slip for non-integral clock division.

It is another object of the present invention to provide a clock divider circuit and associated methods of operation which first performs phase slip for non-integral clock division followed by integral clock division.

It is still another object of the present invention to provide a clock divider circuit and associated methods of operation which first performs integral clock division followed by phase slip for non-integral clock division.

It is yet another object of the invention to provide a clock divider circuit and associated methods of operation which perform integral and non-integral clock division using digital logic devices substantially devoid of analog components.

BRIEF DESCRIPTION OF THE DRAWINGS

FIG. 6 is a block diagram of an exemplary preferred embodiment of a slip control circuit which controls the operation of the slip divider of FIG. 4.

DETAILED DESCRIPTION OF THE PREFERRED EMBODIMENTS

Figure 1:
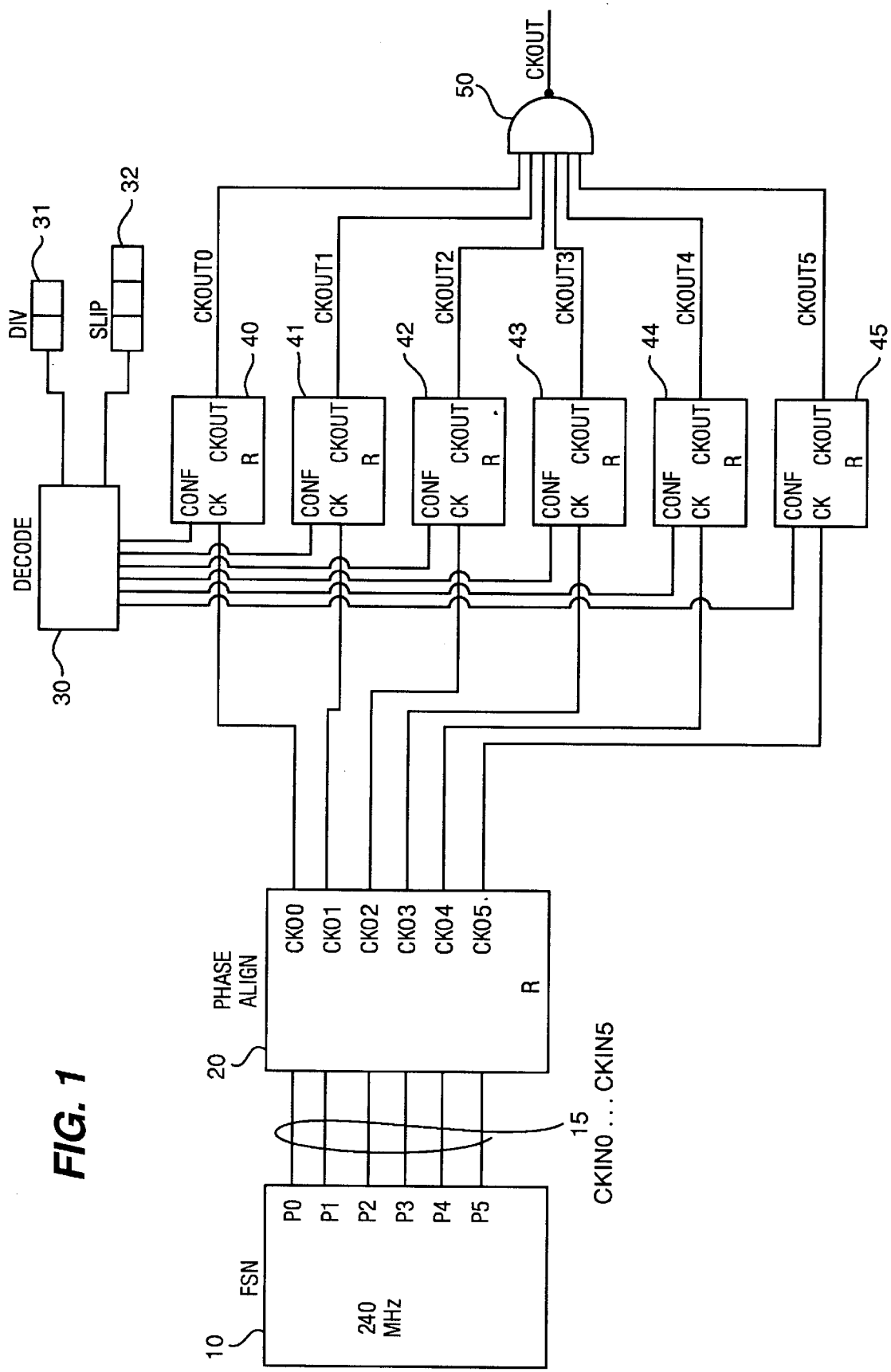
FIG. 1 is block diagram of a first embodiment of the present invention in which a plurality of single phase slip dividers each process a particular phase of a multi-phase frequency synthesizer to contribute to the generation of a final output clock signal.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

FIG. 1 is a block diagram of a circuit of a first embodiment of the present invention which performs integral and non-integral division of a source input clock signal by controlled phase slip techniques. A multi-phase frequency synthesizer 10 (also referred to herein as FSN 10) generates a multi-phase source input clock signal. The source input clock signal preferably has six distinct phases and a base frequency of 240 MHz. Those skilled in the art will recognize that the circuits of the present invention may be applied with any desired base frequency and any number of phases. In addition, the phases of the source input clock signal may be equally spaced or not and may or may not have equal duty cycles. The circuits of the present invention do not attempt to generate a final output clock having a particular duty cycle. Well known techniques may be applied in conjunction with the circuits of the present invention to adjust the duty cycle of the final output clock signal generated as required for a particular application.

The multiple phases of FSN 10 are shown within FSN 10 as P0 . . . P5 and are applied to paths 15 as CKIN0 . . . CKIN5 (corresponding to the HDL descriptions below). CKIN0 . . . CKIN5 clock phase signals are applied via paths 15 to phase align device 20.

A RESET signal is applied to several devices in the circuits described herein with reference to FIGS. 1–6. The RESET signal is presumed to be ubiquitous in the present invention as described herein. Circuits which indicate an input signal labeled "R" (such as phase align device 20) are presumed herein to be connected thereby to an appropriate polarity of the reset signal. All such connections labeled "R" are further presumed to be connected to an inverted signal RESETB (an inverted version of a RESET signal) unless indicated otherwise.

Phase align device 20 includes control circuits to align the multiple phases on paths 15 to the start of a full clock period following a RESET signal. The aligned clock phases are then applied as intermediate output clock signals on paths CKO0 . . . CKO5. These intermediate output clock signals, phase aligned to correspond to the same clock period of FSN 10, are used as input CK to each of a corresponding plurality of single phase slip dividers 40 . . . 45. Specifically, the phase 0 clock signal is applied to single phase slip clock divider 40 input CK, phase 1 to slip divider 41 input CK, phase 2 to 42, phase 3 to 43, phase 4 to 44, and phase 5 to 45.

Each single phase slip divider 40 . . . 45 receives a particular divide configuration on its corresponding CONF input from decode device 30. Decode device 30 reads a desired divide configuration from user programmed registers DIV 31 and SLIP 32. DIV 31 specifies an integer division to be applied to the source input clock (e.g., the input clock phase CKO0 . . . CKO5 applied to the corresponding slip divider 40 . . . 45). SLIP 32 specifies a number of phases to slip the divided clock to achieve a desired non-integral portion of the clock divide.

Each slip divider 40 . . . 45 then applies its configured integer and non-integer division to its corresponding phase of the phase aligned multi-phase input clock signals and applies its output clock signal to its CKOUT signal path. CKOUT0 . . . CKOUT5 correspond to the six processed phases of the source input clock. The six processed phases are then applied as inputs to six input NAND gate 50 to generate the final output clock signal on path CKOUT. The final output clock signal is determined as specified by the user to be a combination of integral and non-integral division of the multi-phase source input clock signals.

Each phase slip divider 40 . . . 45 is synchronously clocked by its corresponding input clock, namely CKO0 . . . CKO5, respectively. Each phase slip divider 40 . . . 45 applies its configured integer divide and phase slip to produce its intermediate output signal CKOUT. Each phase slip divider includes its own integer divide portion which first divides the corresponding clock phase input signal by a preconfigured integral amount. This clock signal resulting from the integral division of the slip dividers input clock is then applied to a phase slip portion of the slip divider. The phase slip portion slips the phase of the signal a preconfigured number of phases and thereby performs the desired non-integer division of the signal.

Each phase slip divider 40 . . . 45 also synchronously determines when its output signal, a processed version of its phase, is to be used as the final output clock by the timing of its phase slip.

Figure 2:
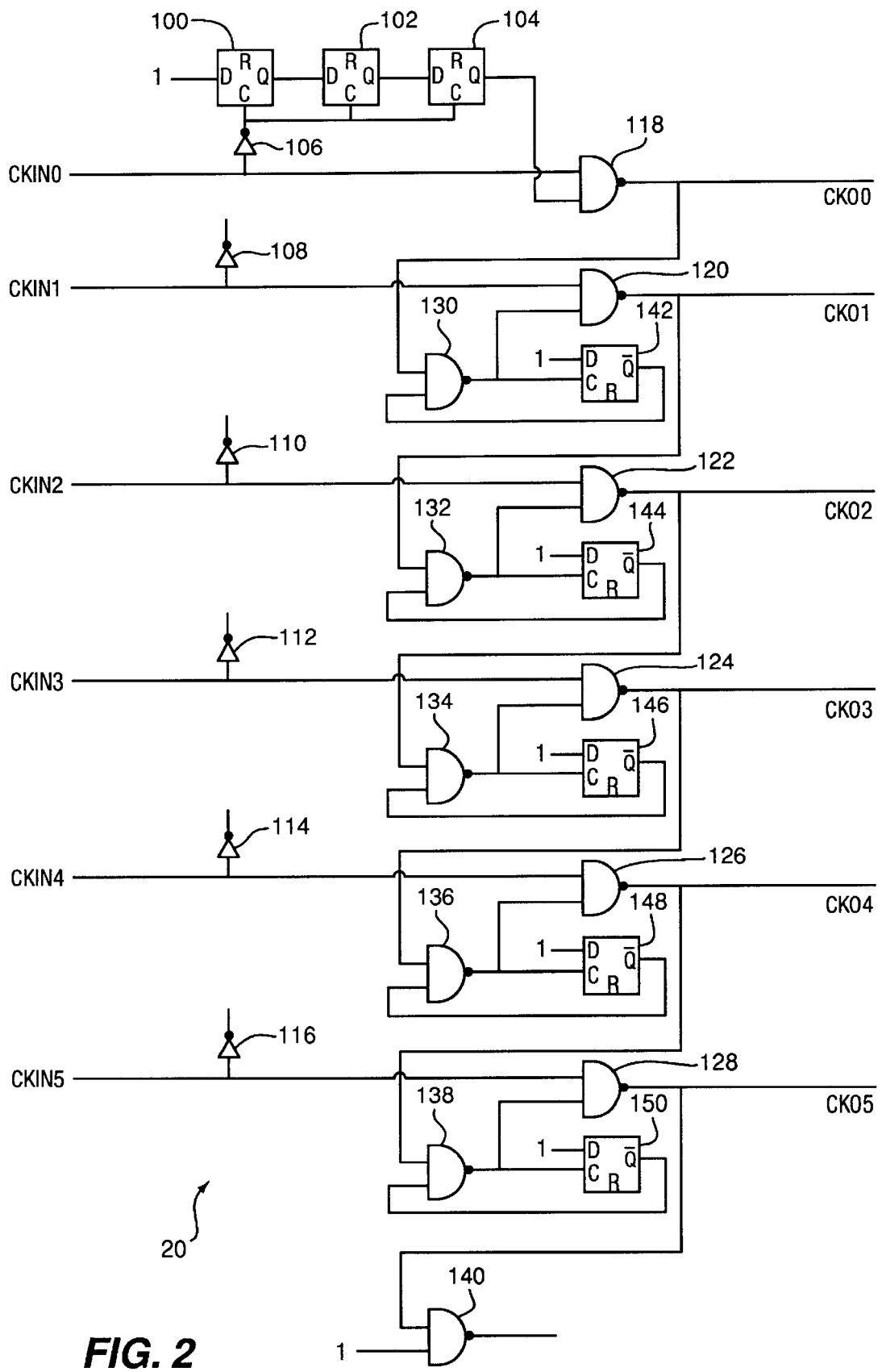
FIG. 2 is a block diagram depicting additional detail of the phase alignment portion of the first embodiment of FIG. 1.

Those skilled in the art will recognize that although FIG. 1 depicts six phases produced by FSN 10 and processed by one of six corresponding phase slip dividers, any number of phases and corresponding phase slip dividers may be applied. Particular applications of the circuits of the present invention may require more or less granularity in the non-integral divisions of the clock supplied by FSN 10. In general, a higher number of phases processed by the circuits of the present invention permits increased granularity in the non-integral clock divisions available from the circuit. FIG. 2 is a block diagram providing additional details of the operation and design of the phase align device 20 of FIG. 1. Phase align device 20 receives the six phases of the source input clock signal on CKIN0 . . . CKIN5 from FSN 10. Circuits within phase align device 20 first assure that there is sufficient time following the assertion of a RESET signal for all devices to properly reset (e.g., flip-flops within other portions of the circuits of the present invention). Generally source input clock signals CKIN0 . . . CKIN5 are applied through phase align device 20 to the corresponding intermediate output signals CKO0 . . . CKO5. However, phase align device 20 delays this signal application until the start of a new phase 0 of the multi-phase clock signal. It is important to proper operation of the first embodiment of the present invention that the multiple phases are aligned before being applied to clock the divide circuits. Aligning the input clocks to the first phase allows the first clock of each phase slip divider 40 . . . 45 to occur in a predictabe order. The order of clocks generated by the six phase slip dividers is important since all six phase slip dividers 40 . . . 45 are programmed to participate in the output clock generation and are programmed to participate in a particular order. If the phase slip dividers were not all aligned to the first phase, they may begin to advance in a different order than the order desired by the programming of the divider circuits.

Flip-flops 100–104 first delay the start of clocking of the slip dividers until two full clock periods following the assertion of a RESET signal. Specifically, flip-flops 100–104 are clocked by phase 0 (CKIN0) of the base clock (FSN 10 of FIG. 1) inverted by inverter 106. The output of the last of the three flip-flops 100–104, namely flip-flop 104, is then applied as an input to NAND gate 118 to enable the application of CKIN0 (phase 0) to CKO0 to begin clocking of the first phase slip divider (40 of FIG. 1). For convenience of notation herein, flip-flops will also be referred to herein as FF or FFs. NAND gates 120 . . . 128 similarly gate the application of their corresponding respective source input phase clocks CKIN1 . . . CKIN5 onto the corresponding respective output clocks CKO1 . . . CKO5. Each is enabled in turn as the previous phase is enabled. FFs 142 . . . 150 in combination with NAND gates 130 . . . 138 serve to lock the enabled condition once the previous phase so initiates the next phase.

Elements 100–150 of FIG. 2 essentially implement a ripple shift register for purposes of aligning the multiple phases of the multi-phase source input clock for application to the corresponding slip dividers on paths CKO0 . . . CKO5. This assures that all slip dividers 40 . . . 45 of FIG. 1 are operating on the same clock period of the base frequency supplied by FSN 10. Inverters 108 . . . 116 are added as an implementation detail for load balancing in the design and perform no useful purpose in the design of the present invention. Likewise, NAND gate 140 serves to balance loads in the ripple shift register. Those skilled in the art will readily recognize a wide variety of equivalent circuits to perform the function of phase alignment of the multi-phase source input clocks as applied to the slip dividers of the present invention. All such equivalent phase alignment circuits are intended as within the scope of the present invention as regards the function of phase alignment.

Figure 3:
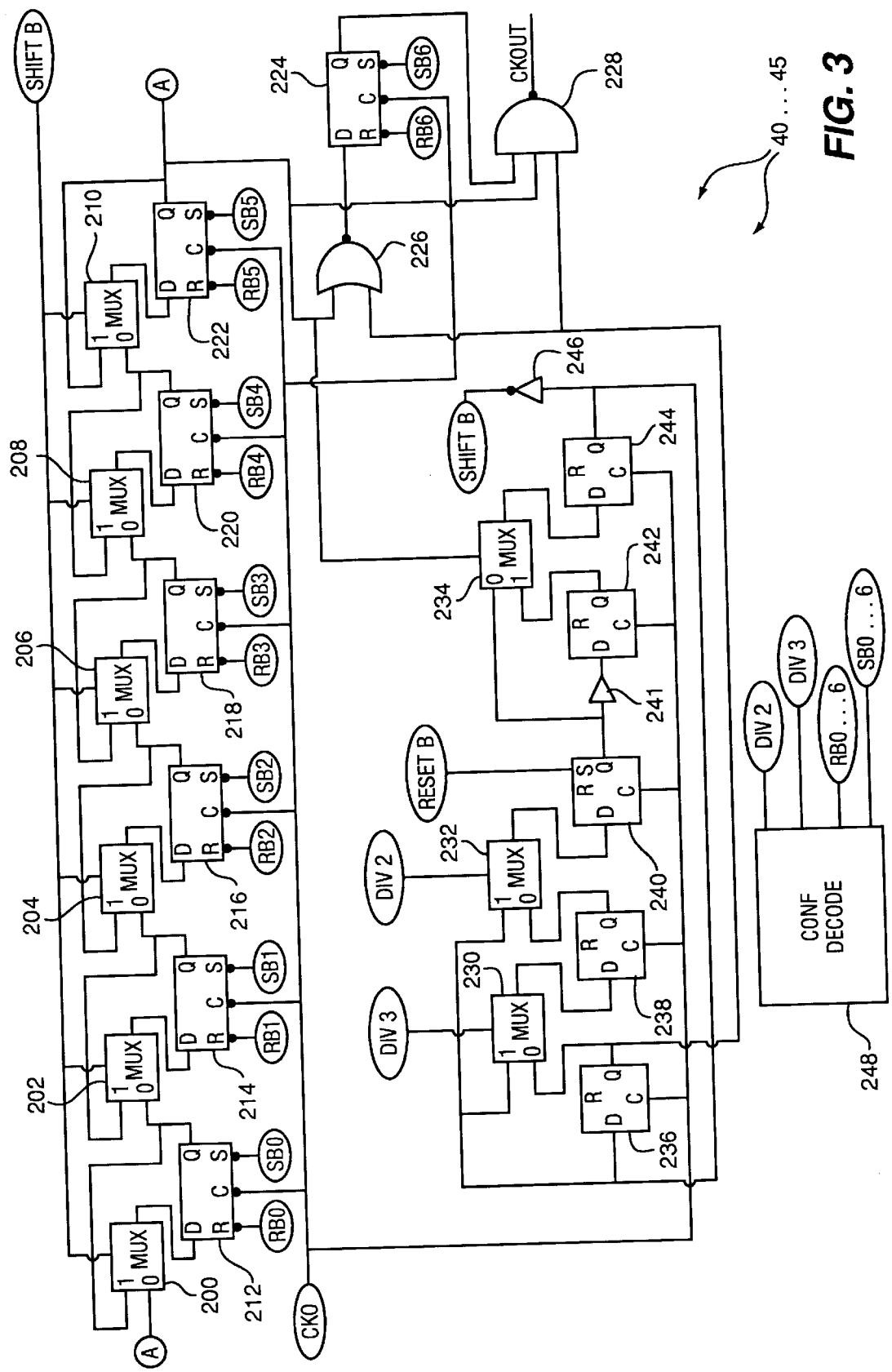
FIG. 3 is a block diagram depicting additional detail of one of the plurality of single phase slip dividers of FIG. 1.

FIG. 3 is a block diagram providing additional detail of the operation and implementation of a single phase slip divider 40 . . . 45 in accordance with the first embodiment of the present invention of FIG. 1. The single phase slip divider (e.g., 40) of FIG. 3 is clocked by its corresponding phase of the multi-phase source input (CKO0. . . CKO5 phase aligned signals as discussed above). As shown in FIG. 3 the signal CKO is the input clock phase CKO0 . . . CKO5 corresponding to the particular phase slip divider (e.g., CKO0 corresponding to phase slip divider 40). All FFs in FIG. 3 are clocked by this input clock phase CKO.

FFs 236 . . . 244, clocked by CKO, provide a standard integral division of the clock frequency of CKO. FFs 236 . . . 240 and 244 are a ring counter for providing the desired divide by 2, 3, or 4 (or others if additional FFs are added to the ring). The ring counter is initialized with a 1 value in FF 240. The 1 value cycles through FFs 244, 236, 238, and 240 with a period of 2, 3, or 4 as programmed by the DIV2 and DIV3 values as noted herein below.

Decode circuit 248 decodes the CONF signals provided by circuit 30 discussed above to configure the desired division of the divider circuit of the present invention. In particular, CONF signals are decoded in block 248 to provide a DIV2 and DIV3 signal indicative of a configuration to apply an integral divide by two and by three respectively. Setting of neither DIV2 nor DIV3 indicates an integral divide by four configuration. DIV2 and DIV3 are applied to mux 232 and 230, respectively, to select the desired configuration of inputs and outputs of the chain of FFs 236 . . . 240 and 244. The output of FF 244 is the CKO signal divided by the configured integral divisor (e.g., 2, 3, or 4 as determined by DIV2 and DIV3).

FF 242 causes the phase slip divider to slip 1 clock period every time the phase slip divider wraps over the last phase. For example, if every other phase is creating an output clock edge (e.g., phase 0, phase 2, phase 4, phase 6, phase 8, phase 10, etc.) but there are only 6 phases in the divider circuit, then phase 6 is really phase 0 with 1 clock period of slip applied. Every time FF 222 outputs a logic 1 value, it is indicating that this phase slip divider should slip 1 clock period.

This divided base frequency clock is used to generate a shift signal for the phase. slip shift register comprising FFs 212 . . . 222. Each FF 212 . . . 222 is preloaded with a zero or one as desired indicating the phase to which the base frequency clock is to be slipped for each successive period. If the base frequency clock is to be applied during phase 0 in the next clock period, the FF 222 is preset with a logic one value. If the base frequency clock is to be applied during phase 1 of the next clock period, FF 220 is preset to a logic value of one, and so on for FFs 218 . . . 212 corresponding to phases 2 . . . 5, respectively. The shift register represented by FFs 212 . . . 222 is then shifted on each period of the base frequency by application of a signal to the SHIFTB signal path output from FF 244 (and inverted by inverter 246). The resultant output clock applied through NAND gate 228 to path CKOUT of the particular slip divider is then slipped by the difference between successive phases which have enabled application of the slipped clock to the output clock path.

The shift register comprising FFs 212 . . . 222 is preloaded during a reset condition of the circuits. During a reset assertion, user defined configuration registers are applied to decode logic element 30 of FIG. 1. Element 30 of FIG. 1 processes the configuration registers by determining the appropriate integer divide to be applied to the plurality of phase slip dividers 40 . . . 45 of FIG. 1 and the preloaded pattern to be applied to the shift register comprising FFs 212 . . . 222 of each phase slip divider 40 . . . 45. As shown in FIG. 1, this configuration information is logically shown as a CONF input applied to each phase slip divider 40 . . . 45 by decode element 30. Decode element 248 within each phase slip divider applies the predetermined divide and slip configuration information to DIV2 and DIV3 as discussed above and to the set and reset inputs of each FF in the phase slip portion of the divider (namely FFs 212 . . . 224). Specifically, RB0 . . . RB6 are decoded from the slip configuration information and applied to FFs 212 . . . 224 on their respective RB input signal paths to reset the respective FF value to zero. In like manner, SB0 . . . SB6 are decoded from the slip configuration information and applied to FFs 212 . . . 224 on their respective SB input signal paths to reset the respective FF value to one. Once so set to the desired preloaded zero and one values, the RB0 . . . RB6 and SB0 . . . SB6 signals are returned to logic high values before the reset cycle ends. The shift register comprising FFs 212 . . . 222 is thereby preloaded with a bit pattern describing the desired phase slip for each phase slip divider 40 . . . 45 for each successive cycle of its respective clock phase.

FF 226 allows a new output clock signal to be generated by this phase slip divider only if FF 222 makes a transition from a 0 value to a 1 value. FF 224 therefore allows multiple slips by this phase slip divider without generation of a new output clock signal. For example, if every fifth phase is programmed to create a clock (i.e., phase 0, phase 5, phase 10, phase 15, phase 20, etc.) phase 10 is really phase 4 with 1 slip while phase 15 is really phase 3 with 2 slips, phase 20 is phase 2 with 3 slips, and so on. The pattern of bits programmed in the shift register by RB0 . . . RB6 and SB0 . . . SB6 thereby controls when to slip and when to generate a clock signal.

The structure and operation of the embodiment of FIG. 1 may be completely understood with reference to the logic description below. The logic graphically presented in FIGS. 1–3 are presented in precise detail as used in conjunction with Verilog compatible CAE design tools.

```
//      This media contains an authorized copy or copies of material
//      copyrighted by Symbios Logic Inc. This copyright notice and
//      any other copyright notices included in machine readable
//      copies must be reproduced on all authorized copies. This is
//      confidential and unpublished property of Symbios Logic Inc.
//
//   Copyright (C) Symbios Logic Inc., 1997.
//   All rights reserved.
module slipdiv(resetb,ckin0,ckin1,ckin2,ckin3,ckin4,ckin5,div,slip,ckout);
input     resetb,      // Reset - Assert while setting dev or slip
   ckin0,      // Input clock phase 0
   ckin1,      // Input clock phase 1
   ckin2,      // Input clock phase 2
   ckin3,      // Input clock phase 3
   ckin4,      // Input clock phase 4
   ckin5;      // Input clock phase 5
input [1:0] div;       // 01=DivBy2, 10=DivBy3, 00=DivBy4
input [2:0] slip;      // Number of phases to slip (between 0 and 5)
output    ckout;       // Output clock at specified frequency
//*************************************************************
reg go,go1,go2;
reg [6:0] slip_ctrl0,slip_ctrl1,slip_ctrl2,slip_ctrl3,slip_ctrl4,slip_ctrl5;
wire ckout0,ckout1,ckout2,ckout3,ckout4,ckout5;
wire [5:0] cko;
```

-continued

```
//**************************************************
//****************** START CODE ********************
//--------------------------------------------------
// Instantiate circuit to phase aLign the dividers for each phase
phaLign PHALIGN (resetb,{ckin5,ckin4,ckin3,ckin2,ckin1,ckin0},
                 cko[5:0]);
//--------------------------------------------------
// instantiate a phase slip divider for each input phase
slipdiv1 SLIPDIV0 (.resetb(resetb), .ck(cko[0]), .div2(div[0]),
        .div3(div[1]), .slip_ctrl(slip_ctrl0[6:0]), .ckout(ckout0));
slipdiv1 SLIPDIV1 (.resetb(resetb), .ck(cko[1]), .div2(div[0]),
        .div3(div[1]), .slip_ctrl(slip_ctrl1[6:0]), .ckout(ckout1));
slipdiv1 SLIPDIV2 (.resetb(resetb), .ck(cko[2]), .div2(div[0]),
        .div3(div[1]), .slip_ctrl(slip_ctrl2[6:0]), .ckout(ckout2));
slipdiv1 SLIPDIV3 (.resetb(resetb), .ck(cko[3]), .div2(div[0]),
        .div3(div[1]), .slip_ctrl(slip_ctrl3[6:0]), .ckout(ckout3));
slipdiv1 SLIPDIV4 (.resetb(resetb), .ck(cko[4]), .div2(div[0]),
        .div3(div[1]), .slip_ctrl(slip_ctrl4[6: 0]), .ckout(ckout4));
slipdiv1 SLIPDIV5 (.resetb(resetb), .ck(cko[5]), .div2(div[0]),
        .div3(div[1]), .slip_ctrl(slip_ctrl5[6:0]), .ckout(ckout5));
//--------------------------------------------------
// OR each of the phases together to complete the MUX
NAN6 ickout (.A(ckout0), . B(ckout1), . C(ckout2), . D(ckout3),
        .E(ckout4), .F(ckout5), .X(ckout));
//--------------------------------------------------
// Define control for phase slip shifter
// - For a given phase slip, the phases are used in a different sequence
// Define the frequency that each phase is used for each phase slip
always @ (slip) begin
    slip_ctrl0[6:0] <= 7'h0
    slip_ctrl1[6:0] <= 7'h0;
    slip_ctrl2[6:0] <= 7'h0;
    slip_ctrl3[6:0] <= 7'h0;
    slip_ctrl4[6:0] <= 7'h0;
    slip_ctrl5[6:0] <= 7'h0;
    case (slip[2:0])
    5'h0: begin
        slip_ctrl0[6:0] <= 7'b1111111;
    end
    5'h1: begin
        slip_ctrl0[5:0] <= 6'b100000;
        slip_ctrl1[5:0] <= 6'b010000;
        slip_ctrl2[5:0] <= 6'b001000;
        slip_ctrl3[5:0] <= 6'b000100;
        slip_ctrl4[5:0] <= 6'b000010;
        slip_ctrl5[5:0] <= 6'b000001;
    end
    5'h2: begin
        slip_ctrl0[5:0] <= 6'b100100;
        slip_ctrl2[5:0] <= 6'b010010;
        slip_ctrl4[5:0] <= 6'b001001;
    end
    5'h3: begin
        slip_ctrl0[5:0] <= 6'b101010;
        slip_ctrl3[5:0] <= 6'b010101;
    end
    5'h4: begin
        slip_ctrl0[5:0] <= 6'b110110;
        slip_ctrl2[5:0] <= 6'b101101;
        slip_ctrl4[5:0] <= 6'b011011;
    end
    5'h5: begin
        slip_ctrl0[5:0] <= 6'b111110;
        slip_ctrl1[5:0] <= 6'b111101;
        slip_ctrl2[5:0] <= 6'b111011;
        slip_ctrl3[5:0] <= 6'b110111;
        slip_ctrl4[5:0] <= 6'b101111;
        slip_ctrl5[5:0] <= 6'b011111;
    end
endcase
end
endmodule
//////////////////////////////////////////////////
//////////////////////////////////////////////////
//////////////////////////////////////////////////
//
//    Module:       slipdiv1
//    Called From:  slipdiv.v
//    Modules Called:   none
//
// Description:
//
//////////////////////////////////////////////////
module slipdiv1 (resetb,ck,div2,div3,slip_ctrl,ckout);
input   resetb,   // Reset - Assert while setting dev or slip
        ck,       // Input clock phase
        div2,     // Main divide is by 2
        div3;     // Main divide is by 3
input [6:0] slip_ctrl; // Vector for set/reset of slip shifter
output  ckout;    // Output clock for this phase
//**************************************************
wire [6:0] slip_rb,slip_sb;
//**************************************************
//****************** START CODE ********************
//--------------------------------------------------
// Define slip shifter
// - Set/Reset with pattern which defines how often to use this phase
// - Slip shifter shifts on the divided clock
// - Everytime this phase is used, cause divider to slip one phase
//   to align it for providing the correct phase for the next clock
DFFRSPQ iss0 (.CK(ck), .D(ssmx0), .RB(slip_rb[0]), .SB(slip_sb[0]),
        .Q(ss0));
DFFRSPQ iss1 (.CK(ck), .D(ssmx1), .RB(slip_rb[1]), .SB(slip_sb[1]),
        .Q(ss1));
DFFRSPQ iss2 (.CK(ck), .D(ssmx2), .RB(slip_rb[2]), .SB(slip_sb[2]),
        .Q(ss2));
DFFRSPQ iss3 (.CK(ck), .D(ssmx3), .RB(slip_rb[3]), .SB(slip_sb[3]),
        .Q(ss3));
DFFRSPQ iss4 (.CK(ck), .D(ssmx4), .RB(slip_rb[4]), .SB(slip_sb[4]),
        .Q(ss4));
DFFRSPQ iss5 (.CK(ck), .D(ssmx5), .RB(slip_rb[5]), .SB(slip_sb[5]),
        .Q(ss5));
DFFRSPQ iss6 (.CK(ck), .D(ssor6), .RB(slip_rb[6]), .SB(slip_sb[6]),
        .Q(ss6));
MUX2 issmx0 (.A(ss5), .B(ss0), .SL(shiftb), .X(ssmx0));
MUX2 issmx1 (.A(ss0), .B(ss1), .SL(shiftb), .X(ssmx1));
MUX2 issmx2 (.A(ss1), .B(ss2), .SL(shiftb), .X(ssmx2));
MUX2 issmx3 (.A(ss2), .B(ss3), .SL(shiftb), .X(ssmx3));
MUX2 issmx4 (.A(ss3), .B(ss4), .SL(shiftb), .X(ssmx4));
MUX2 issmx5 (.A(ss4), .B(ss5), .SL(shiftb), .X(ssmx5));
NOR2 isso6 (.A(ss5), .B(divff4),     .X(sso6));
//--------------------------------------------------
// Define set/reset bus for slip shifter
OR2 irb0 (.A(resetb), .B(slip_ctrl[0]), .X(slip_rb[0]));
OR2 irb1 (.A(resetb), .B(slip_ctrl[1]), .X(slip_rb[1]));
OR2 irb2 (.A(resetb), .B(slip_ctrl[2]), .X(slip_rb[2]));
OR2 irb3 (.A(resetb), .B(slip_ctrl[3]), .X(slip_rb[3]));
OR2 irb4 (.A(resetb), .B(slip_ctrl[4]), .X(slip_rb[4]));
OR2 irb5 (.A(resetb), .B(slip_ctrl[5]), .X(slip_rb[5]));
OR2 irb6 (.A(resetb), .B(slip_ctrl[6]), .X(slip_rb[6]));
NAN2 isb0 (.A(reset), .B(slip_ctrl[0]), .X(slip_sb[0]));
NAN2 isb1 (.A(reset), .B(slip_ctrl[1]), .X(slip_sb[1]));
NAN2 isb2 (.A(reset), .B(slip_ctrl[2]), .X(slip_sb[2]));
NAN2 isb3 (.A(reset), .B(slip_ctrl[3]), .X(slip_sb[3]));
NAN2 isb4 (.A(reset), .B(slip_ctrl[4]), .X(slip_sb[4]));
NAN2 isb5 (.A(reset), .B(slip_ctrl[5]), .X(slip_sb[5]));
INV isb6 (.A(slip_ctrl[6]), .X(slip_sb[6]));
INV ires (.A(resetb), .X(reset));
//--------------------------------------------------
// Define clock divider shift register
// - Reset shift register with only one 0 and the rest to 1
// The one zero defines when the shift to the slip shifter occurs
// This creates a long pwh and a short pwl. This is best since
// the phase slipping outside this module will extend the pwl.
// - Define a divide by 2, 3, or 4 with even duty-cycle only with 2
// - Define a bypass for performing the slip
// - Initiate shift of slip shifter everytime divff1 goes low
DFFRPQ idivff0 (.CK(ck), .D(mxslip), .RB(resetb),     .Q(divff0));
DFFRPQ idivff1 (.CK(ck), .D(hold2),  .RB(resetb),     .Q(divff1));
DFFRSPQ idivff2 (.CK(ck), .D(mx2), .RB(1'b1), .SB(resetb), .Q(divff2));
DFFRPQ idivff3 (.CK(ck), .D(mx3), .RB(resetb),        .Q(divff3));
DFFRPQ idivff4 (.CK(ck), .D(divff0), .RB(resetb),     .Q(divff4));
MUX2 imx2 (.A(divff3), .B(divff0), .SL(div2), .X(mx2));
MUX2 imx3 (.A(divff4), .B(divff0), .SL(div3), .X(mx3));
MUX2 imxslip (.A(divff2), .B(divff1), .SL(ss5), .X(mxslip));
BUF ihold (.A(divff2), .X(hold2));
INV3 ishift (.A(divff0), .X(shiftb));
```

```
//-----------------------------------------------------------------
// - Enable this phase to set final clock if slip shifter is enabling
// and the divider circuit is high
NAN3M ickout (.A(ss5), .B(divff4), .C(ss6), .X(ckout));
endmodule
///////////////////////////////////////////////////////////////////
///////////////////////////////////////////////////////////////////
///////////////////////////////////////////////////////////////////
///////////////////////////////////////////////////////////////////
//
//      Module:         phalign
//      Called From:    slipdiv.v
//      Modules Called: none
//
// Description:
//
///////////////////////////////////////////////////////////////////
module phalign (resetb,cki[5:0],cko[5:0]);
input    resetb;      // Reset - Assert while setting dev or slip
input [5:0] cki;      // Vector for set/reset of slip shifter
output [5:0] cko;     // Output clock for this phase
//*****************************************************************
//******************** START CODE *********************************
//-----------------------------------------------------------------
// Define synchronizeR to align all phase dividers
// - Define enough clocks to allow removal of resetb inside slipdiv module
// and to allow good synchronizing to the fast clock
// - Add an INV on every phase to match loading
DFFRPQ igo1 (.CK(ckin0b), .D(1'b1), .RB(resetb), .Q(go1));
DFFRPQ igo2 (.CK(ckin0b), .D(go1), .RB(resetb), .Q(go2));
DFFRPQ igo3 (.CK(ckin0b), .D(go2), .RB(resetb), .Q(go3));
INV ii0 (.A(cki[0]), .X(ckin0b));
INV ii1 (.A(cki[1]), .X(ckin1b));
INV ii2 (.A(cki[2]), .X(ckin2b));
INV ii3 (.A(cki[3]), .X(ckin3b));
INV ii4 (.A(cki[4]), .X(ckin4b));
INV ii5 (.A(cki[5]), .X(ckin5b));
//-----------------------------------------------------------------
// Start all clocks based on above synchronizing point
// - Use ripple approach to guarantee phase relationship
NAN2 iock0 (.A(cki[0]), .B(go3), .X(cko[0]));
NAN2 iock1 (.A(cki[1]), .B(enab1), .X(cko[1]));
NAN2 iock2 (.A(cki[2]), .B(enab2), .X(cko[2]));
NAN2 iock3 (.A(cki[3]), .B(enab3), .X(cko[3]));
NAN2 iock4 (.A(cki[4]), .B(enab4), .X(cko[4]));
NAN2 iock5 (.A(cki[5]), .B(enab5), .X(cko[5]));
NAN2 ienab0 (.A(cko[5]), .B(1'b1), .X(enab0)); // <- Load balancing
NAN2 ienab1 (.A(cko[0]), .B(lock1b), .X(enab1));
NAN2 ienab2 (.A(cko[1]), .B(lock2b), .X(enab2));
NAN2 ienab3 (.A(cko[2]), .B(lock3b), .X(enab3));
NAN2 ienab4 (.A(cko[3]), .B(lock4b), .X(enab4));
NAN2 ienab5 (.A(cko[4]), .B(lock5b), .X(enab5));
//-----------------------------------------------------------------
// Once phase relationship is established, set lock condition
// - In this condition, only the input phase clock has an impact
// to the pulse shape of the output clocks
DFFRP ilock1 (.CK(enab1), .D(1'b1), .RB(resetb), .Q(lock1),
.QB(lock1b));
DFFRP ilock2 (.CK(enab2), .D(1'b1), .RB(resetb), .Q(lock2),
.QB(lock2b));
DFFRP ilock3 (.CK(enab3), .D(1'b1), .RB(resetb), .Q(lock3),
.QB(lock3b));
DFFRP ilock4 (.CK(enab4), .D(1'b1), .RB(resetb), .Q(lock4),
.QB(lock4b));
DFFRP ilock5 (.CK(enab5), .D(1'b1), .RB(resetb), .Q(lock5),
.QB(lock5b));
endmodule
```

Figure 4:
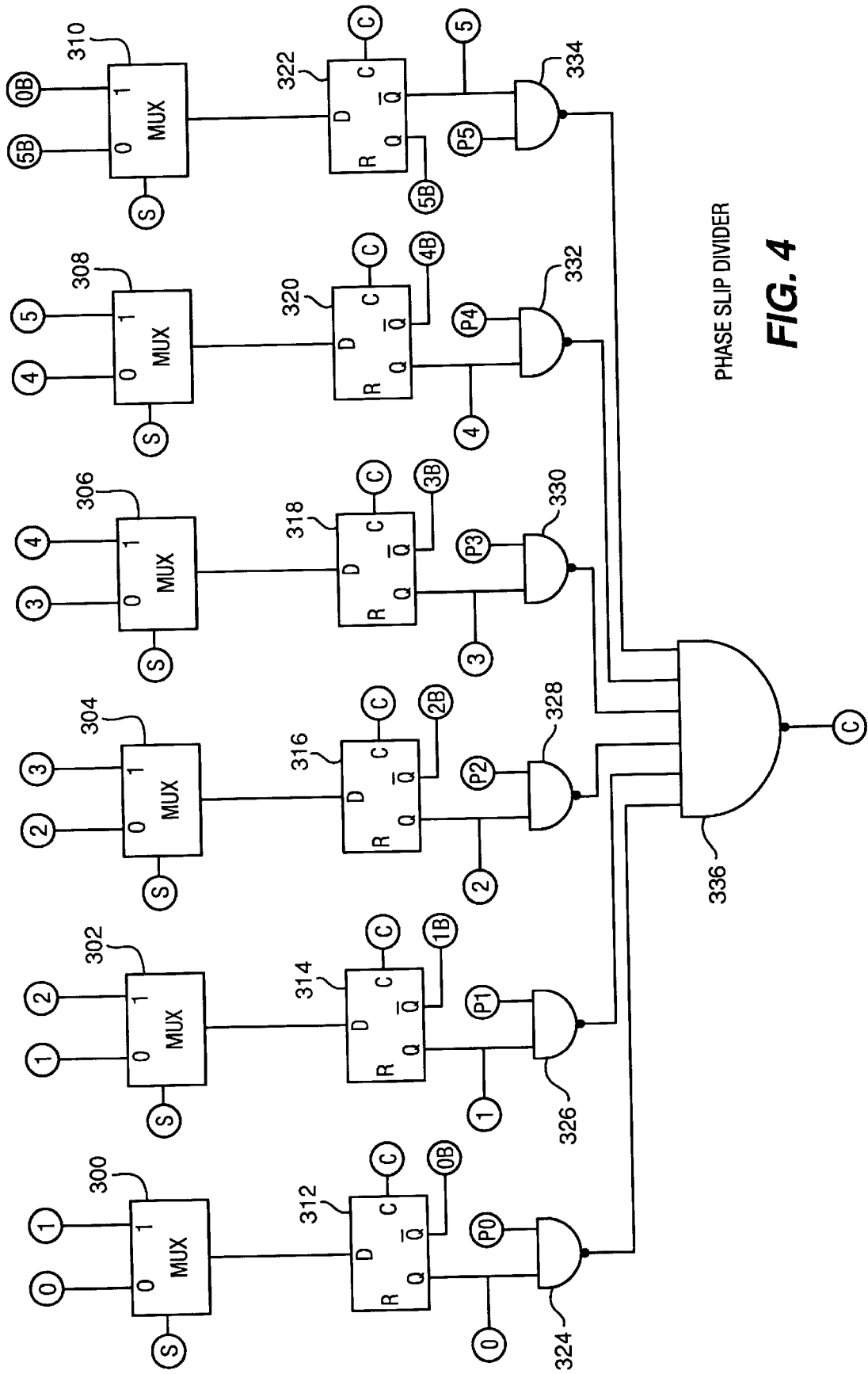
FIG. 4 is a block diagram of a second embodiment of the present invention in which a single, simpler phase slip divider processes all phases of a multi-phase frequency synthesizer to generate an output clock signal as a non-integral division of the base frequency.
Figure 5:
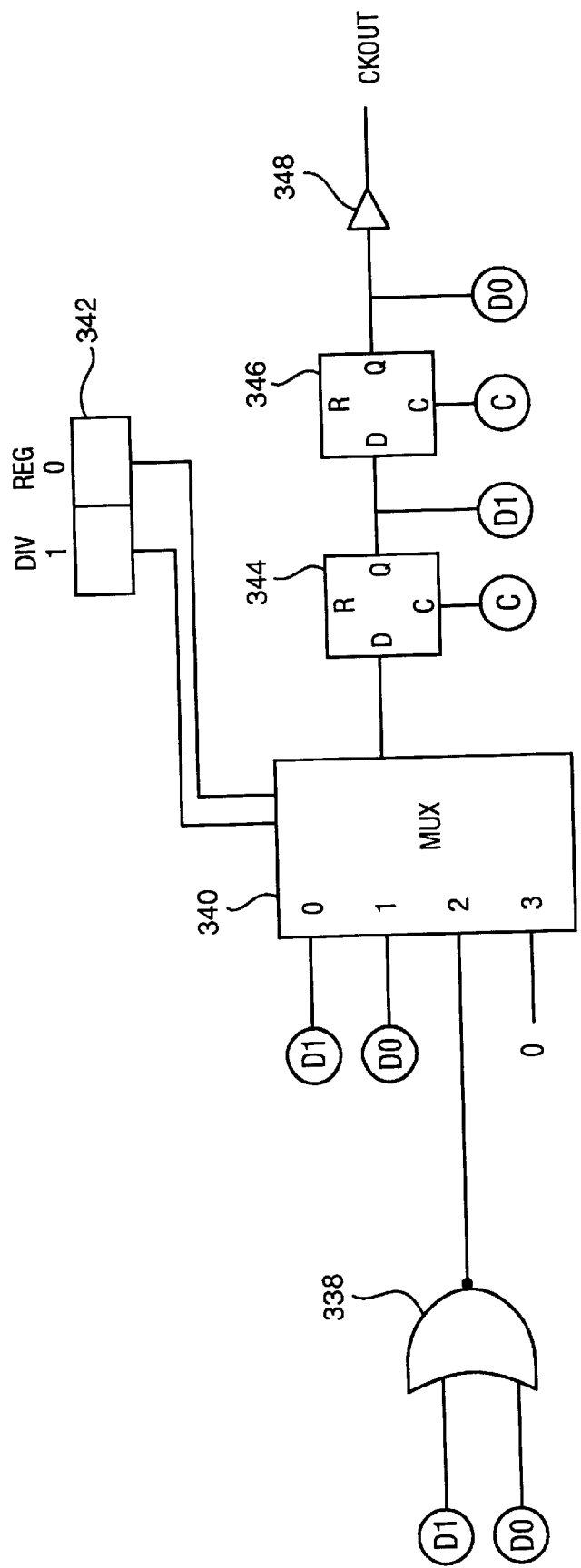
FIG. 5 is a block diagram of an exemplary integer clock divider which applies an integer division to the output signal generated by the phase slip divider of FIG. 4 to generate a final output clock signal.

FIGS. 4–6 are block diagrams depicting a second embodiment of a phase slip divider of the present invention. In the invention of FIGS. 4–6, a single phase slip divider circuit of FIG. 4 provides phase slip functionality for the multi-phase output of a frequency synthesizer (as shown in FIG. 1). Specifically, the individual phases of such a frequency synthesizer are shown as labels P0 . . . P5 as inputs to NAND gates 324 . . . 334, respectively.

An output signal of each of FFs 312 . . . 322 is applied as the other input to NAND gates 324 . . . 334, respectively. For FFs 312 . . . 320 the Q output, labeled 0 . . . 4, respectively, is so applied to the input of NAND gates 324 . . . 332, respectively. In the case of FF 322, the QBAR active low signal, labeled 5, is applied as an input to NAND gate 334.

NAND gate 336 receives the output of NAND gates 324 . . . 334 as its input signals to produce the intermediate output clock signal labeled C. The "NAND structure" comprising NAND gates 324 . . . 336 act essentially as a multiplexor to select one of the six possible phase slipped clocks as the present output clock "C" of the phase slip divider circuit of FIG. 4. Muxes 300 . . . 310 each receive a present phase clock signal and a next phase clock signal as their respective inputs. Specifically, mux 300 receives the phase 0 clock signal labeled 0 and generated as the output signal of FF 312 as a first input and receives phase 1 labeled 1 and generated as the output signal of FF 314 as its second input. Similarly, mux 302 receives phase 1 and 2, mux 304 receives phase 2 and 3, etc.

The phase slip divider of FIG. 4 therefore first performs a phase slip operation on a multi-phase input clock signal by determining at each phase signal of the clock whether the present phase of the intermediate output clock signal should "stay" at the value of the present phase on the next phase's clock edge, or shift to the value of the next phase's clock signal.

The phase slipped intermediate output clock signal labeled C is then applied to a standard integer division circuit to apply any desired integral division to the intermediate output clock signal to thereby produce the final output clock signal labeled CKOUT. FIG. 5 depicts one such standard integer clock divider clocked by the intermediate output clock signal labeled C and producing CKOUT based upon the integral division configuration defined by the DIV REG 342.

FIG. 6 depicts a ring counter circuit used to generate a signal indicative to the phase slip divider muxes 300 . . . 310 whether to "stay" or "shift" on the next phase's clock pulse.

The phase slip clock divider circuit of the second embodiment is significantly simpler than that of the first embodiment but at the cost of flexibility. The maximum frequency generated by the phase slip clock divider circuits of the second embodiment is 5/6 of the base frequency of the frequency synthesizer in order to prevent glitches on the clock. Though substantially more complex, the first embodiment enables a much broader range of clock synthesis including output clock frequencies faster than the base frequency of the frequency synthesizer.

The structure and operation of the embodiment of FIGS. 4–6 may be completely understood with reference to the logic description below. The logic graphically presented in FIGS. 4–6 are presented in precise detail as used in conjunction with Verilog compatible CAE design tools.

```
// This media contains information confidential and proprietary to
// Symbios Logic Inc. It shall not be reproduced in whole or in part,
// incorporated into other documents or media, disclosed to third
// parties or used for any purpose other than that for which is authorized
// without the prior written consent of Symbios Logic Inc.
//
// Copyright (C) Symbios Logic Inc., 1997.
// All rights reserved.
module slipdiv2 (
resetb, ckin0, ckin1, ckin2, ckin3, ckin4, ckin5, slip, div, ckout
);
input       resetb;      // Reset - Assert while setting slip or div
```

-continued

```
input       ckin0;      // Input clock phase 0
input       ckin1;      // Input clock phase 1
input       ckin2;      // Input clock phase 2
input       ckin3;      // Input clock phase 3
input       ckin4;      // Input clock phase 4
input       ckin5;      // Input clock phase 5
input [3:0] slip;       // Value to load into slip shifter
input [1:0] div;        // 01=DivBy2, 10=DivBy3, 00=DivBy4
output      ckout;      // Output clock at specified frequency
//--------------------------------------------------------------
// Define Slip Control Logic
//
// Slip is used to indicate to the Phase Select logic to either hold the
// current phase or to Slip. The duty cycle of the Slip logic and the
// input period determine the average period of the SlipCk using
// the following formula:
//       PeriodIn * (1 - 1/6*(DutyCycle))
// It is important that the selected phases shift from a later phase to an
// earlier phase (larger number to lower number) in order to prevent
// glitches on the SlipCk and for the formula above to be true.
//
// The Slip control logic is basically a parallel load shift register
// that allows external logic to control the duty cycle of the Slip signal.
// Many other methods could be used here.
//--------------------------------------------------------------
MUX2  SlpIn0 (.A(Slip1), .B(slip[0]), .SL(Load), .X(SlipIn0));
MUX2  SlpIn1 (.A(Slip2), .B(slip[1]), .SL(Load), .X(SlipIn1));
MUX2  SlpIn2 (.A(Slip3), .B(slip[2]), .SL(Load), .X(SlipIn2));
MUX2  SlpIn3 (.A(1'b0),  .B(slip[3]), .SL(Load), .X(SlipIn3));
NOR3  nLd    (.A(Slip1), .B(Slip2), .C(Slip3), .X(Load));
DFFRPQ  Slp0 (.D(SlipIn0), .RB(resetb), .CK(SlipCk), .Q(Slip0));
DFFRPQ  Slp1 (.D(SlipIn1), .RB(resetb), .CK(SlipCk), .Q(Slip1));
DFFRPQ  Slp2 (.D(SlipIn2), .RB(resetb), .CK(SlipCk), .Q(Slip2));
DFFRPQ  Slp3 (.D(SlipIn3), .RB(resetb), .CK(SlipCk), .Q(Slip3));
//--------------------------------------------------------------
// Define Phase Select/Phase Slip Logic (twisted ring counter)
//--------------------------------------------------------------
MUX2  SlIn0 (.A(Sel0), .B(Sel1), .SL(Slip0), .X(SelIn0));
MUX2  SlIn1 (.A(Sel1), .B(Sel2), .SL(Slip0), .X(SelIn1));
MUX2  SlIn2 (.A(Sel2), .B(Sel3), .SL(Slip0), .X(SelIn2));
MUX2  SlIn3 (.A(Sel3), .B(Sel4), .SL(Slip0), .X(SelIn3));
MUX2  SlIn4 (.A(Sel4), .B(Sel5), .SL(Slip0), .X(SelIn4));
MUX2  SlIn5 (.A(nSel5), .B(nSel0), .SL(Slip0), .X(SelIn5));
DFFRP  Sl0  (.D(SelIn0), .RB(resetb), .CK(SlipCk), .Q(Sel0),
             .QB(nSel0));
DFFRP  Sl1  (.D(SelIn1), .RB(resetb), .CK(SlipCk), .Q(Sel1),
             .QB(nSel1));
DFFRP  Sl2  (.D(SelIn2), .RB(resetb), .CK(SlipCk), .Q(Sel2),
             .QB(nSel2));
DFFRP  Sl3  (.D(SelIn3), .RB(resetb), .CK(SlipCk), .Q(Sel3),
             .QB(nSel3));
DFFRP  Sl4  (.D(SelIn4), .RB(resetb), .CK(SlipCk), .Q(Sel4),
             .QB(nSel4));
DFFRP  Sl5  (.D(SelIn5), .RB(resetb), .CK(SlipCk), .Q(nSel5),
             .QB(Sel5));
//--------------------------------------------------------------
// Define SlipCk (6-way mux)
//--------------------------------------------------------------
NAN2  SlpCk0 (.A(ckin0), .B(Sel0), .X(SlipCk0));
NAN2  SlpCk1 (.A(ckin1), .B(Sel1), .X(SlipCk1));
NAN2  SlpCk2 (.A(ckin2), .B(Sel2), .X(SlipCk2));
NAN2  SlpCk3 (.A(ckin3), .B(Sel3), .X(SlipCk3));
NAN2  SlpCk4 (.A(ckin4), .B(Sel4), .X(SlipCk4));
NAN2  SlpCk5 (.A(ckin5), .B(Sel5), .X(SlipCk5));
NAN6  SlpCk  (.A(SlipCk0), .B(SlipCk1), .C(SlipCk2),
              .D(SlipCk3), .E(SlipCk4), .F(SlipCk5), .X(SlipCk));
//--------------------------------------------------------------
// Define Divide By Logic (programmable Johnson-counter)
//
// This logic is provided for example only. Any integer divide-by logic
// could replace this logic.
//--------------------------------------------------------------
INV    FdBck2 (.A(Div0), .X(FeedBack2));
NOR2   FdBck3 (.A(Div0), .B(Div1), .X(FeedBack3));
INV    FdBck4 (.A(Div1), .X(FeedBack4));
MUX4   DvIn  (.A(FeedBack4), .B(FeedBack2), .C(FeedBack3), .D(1'b0),
              .SLI(div[1]), .SL0(div[0]), .X(DivIn));
DFFRPQ Dv0  (.D(DivIn), .RB(resetb), .CK(SlipCk), .Q(Div0));
DFFRPQ Dv1  (.D(Div0), .RB(resetb), .CK(SlipCk), .Q(Div1));
```

-continued

```
BUF    ckt   (.A(Div1), .X(ckout));
endmodule
```

Those skilled in the art will recognize that both embodiments of the clock divider of the present invention provide for extensive flexibility in programming particular sequences of integer division and phase slip division to produce a wide variety of integral and non-integral output clock signal waveforms. In particular, the first embodiment, described above with respect to FIGS. 1–3, permits many programmed combinations including some combinations which may produce unexpected (essentially useless) results. As presented above with respect to HDL (e.g., Verilog) implementations, only likely useful combinations are implemented in the preferred embodiments. Those skilled in the art may recognize other patterns useful in particular applications which may be programmed in to the clock divider of the present invention.

Those skilled in the art will further recognize the dynamic programmability of the clock dividers of the present invention. Not only are the dividers programmable to generate a wide variety of waveforms, but they may be so programmed dynamically, essentially while operating. Such dynamic operation of a non-integral clock divider applied to a fixed input frequency and implemented with digital logic devices is also believed to be novel in the art.

Lastly, those skilled in the art will recognize that the clock dividers of the present invention provide clock generation using digital devices while reducing (or eliminating) unwanted generation of "glitches." Such glitches (unwanted transitions due to timing constraints) are avoided in the first embodiment (that of FIGS. 1–3) by operating the phase slip dividers in accordance with phase aligned starting phases (as noted above) and by the generally synchronous nature of the embodiment. The second embodiment (that of FIGS. 4–6) avoids unwanted glitch generation by permitting only "slips" of only one phase at a time and only in one direction of the phase relationships. Only an "earlier" phase may be selected in the phase slip divider of the second embodiment of the invention. This aspect of the invention avoids generation of glitches due to speed of the NAND multiplexor structure therein.

While the invention has been illustrated and described in detail in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. A clock divider circuit comprising:
   an integral divider portion for dividing a source input clock signal by an integral divisor to produce a divided clock signal; and
   a phase slip portion for applying a predetermined phase slip to said divided clock signal to produce a phase slipped divided clock signal as a non-integral division of said source input clock signal.

2. The circuit of claim 1 wherein said phase slip portion is programmable to perform a selected predetermined non-integral division of the frequency of said divided clock signal to produce said phase slipped divided clock signal.

3. The circuit of claim 2 wherein said phase slip portion includes:

a programmable shift register having a number of positions representative of the number of phases by which said divided clock signal is slipped and the output of which determines when said divided clock signal is to be applied to said phase slipped divided clock signal wherein said programmable shift register is programmed to determine on which of said number of phases said divided clock is to be applied to said phase slipped divided clock signal.

4. A clock divider circuit comprising:

a multi-phase frequency synthesizer which generates a plurality of source input clock signals at a predetermined base frequency wherein said plurality of source input clock signals have a predetermined phase relationship;

a plurality of phase slip dividers wherein each of said plurality of phase slip dividers is associated with a unique one of said plurality of source input clock signals generated by said multi-phase frequency synthesizer and wherein each of said plurality of phase slip dividers controllably slips its associated source input clock signal by a predetermined phase offset to produce an output signal; and control means for selectively combining said output signal of each of said plurality of phase slip dividers to generate a final output clock signal.

5. The circuit of claim 4 wherein at least one of said plurality of phase slip dividers includes:

an integral divider portion for dividing its said unique one of said plurality of source input clock signals by an integral divisor to produce an intermediate output clock signal; and a programmable shift register having a number of positions representative of the number of phases by which said intermediate output clock signal is slipped and the output of which determines when said intermediate output clock signal is to be applied to said final output clock signal, and wherein said programmable shift register is programmed to determine on which of said number of phases said intermediate output clock signal is to be applied to said final output clock signal.

6. The circuit of claim 5 wherein said programmable shift register includes:

means for wrapping its last of said number of positions to the first of said number of positions to wrap the state of said programmable shift register corresponding to the last phase of its said unique one of said plurality of source input clock signals to the state of said programmable shift register corresponding to the first phase of a next period of its said unique one of said plurality of source input clock signals.

7. The circuit of claim 4 wherein said control means includes:

means for generating said final output signal from the plurality of output signals from said plurality of phase slip dividers without generating a glitch.

8. The circuit of claim 4 further comprising:

a ripple shift register coupled between said multi-phase frequency synthesizer and said plurality of phase slip dividers such that said ripple shift register synchronizes application of said plurality of source input clock signals to said plurality of phase slip dividers to align the phases of said plurality of source input clock signals as applied to said plurality of phase slip dividers.

9. The circuit of claim 4 wherein the phases of said source input clock signals are equally spaced.

10. The circuit of claim 4 wherein the phases of said source input clock signals are unequally spaced.

11. The circuit of claim 4 wherein the phases of said source input clock signals have equal duty cycles.

12. The circuit of claim 4 wherein the phases of said source input clock signals have unequal duty cycles.

13. The circuit of claim 4 wherein each of said phase slip dividers divides its associated source input clock signal by an integral divisor and its associated output signal is a non-integral division of its associated source input clock signal.

14. The circuit of claim 4 wherein said circuit uses exclusively digital logic devices.

15. A clock divider circuit comprising:

a phase slip portion for applying a predetermined phase slip to a source input clock signal to produce a phase slipped clock signal as a non-integral division of said source input clock signal; and an integral divider portion for dividing said phase slipped clock signal by an integral divisor to produce a phase slipped divided clock signal as a non-integral division of said source input clock signal.

16. The circuit of claim 15 wherein said phase slip portion comprises a twisted ring counter.

17. The circuit of claim 16 wherein said integral divider portion comprises a Johnson counter.

18. A clock divider circuit comprising:

multi-phase frequency synthesizer which generates a plurality of source input clock signals at a predetermined frequency wherein said plurality of source input clock signals have a first predetermined phase relationship therebetween;

a programmable phase slip portion coupled to said multi-phase frequency synthesizer to receive each of said plurality of source input clock signals and generate therefrom a plurality of intermediate output clock signals having a second predetermined phase relationship therebetween;

a multiplexer for selectively producing one of said plurality of intermediate output clock signals as a second intermediate output clock signal; and an integral divider portion for dividing said second intermediate output clock signal by an integral divisor to produce an output clock signal as a non-integral division of said plurality of source input clock signals.

19. The circuit of claim 18 wherein said phase slip portion comprises a twisted ring counter.

20. The circuit of claim 19 wherein said integral divider portion comprises a Johnson counter.

* * * * *